United States Patent
Chen et al.

(10) Patent No.: US 9,460,797 B2
(45) Date of Patent: Oct. 4, 2016

(54) NON-VOLATILE MEMORY CELL STRUCTURE AND NON-VOLATILE MEMORY APPARATUS USING THE SAME

(71) Applicant: eMemory Technology Inc., Hsinchu (TW)

(72) Inventors: Chih-Chun Chen, Taipei (TW); Chun-Hung Lin, Hsinchu (TW); Cheng-Da Huang, Hsinchu County (TW)

(73) Assignee: eMemory Technology Inc., Hsinchu (TW)

(*) Notice: Subject to any disclaimer, the term of this patent is extended or adjusted under 35 U.S.C. 154(b) by 9 days.

(21) Appl. No.: 14/607,066

(22) Filed: Jan. 27, 2015

(65) Prior Publication Data

US 2016/0104534 A1   Apr. 14, 2016

Related U.S. Application Data

(60) Provisional application No. 62/062,963, filed on Oct. 13, 2014.

(51) Int. Cl.
| | |
|---|---|
| *G11C 16/10* | (2006.01) |
| *G11C 16/14* | (2006.01) |
| *H01L 27/115* | (2006.01) |
| *G11C 5/06* | (2006.01) |
| *H01L 29/10* | (2006.01) |
| *H01L 29/06* | (2006.01) |
| *G11C 16/08* | (2006.01) |
| *H01L 27/092* | (2006.01) |
| *H02M 1/14* | (2006.01) |
| *G11C 16/04* | (2006.01) |
| *G11C 16/30* | (2006.01) |
| G11C 16/26 | (2006.01) |
| H02M 3/07 | (2006.01) |

(52) U.S. Cl.
CPC .............. *G11C 16/14* (2013.01); *G11C 5/063* (2013.01); *G11C 16/0433* (2013.01); *G11C 16/08* (2013.01); *G11C 16/10* (2013.01); *G11C 16/30* (2013.01); *H01L 27/092* (2013.01); *H01L 27/11521* (2013.01); *H01L 27/11526* (2013.01); *H01L 29/0642* (2013.01); *H01L 29/1095* (2013.01); *H02M 1/14* (2013.01); G11C 16/26 (2013.01); H02M 3/07 (2013.01)

(58) Field of Classification Search
CPC   H01L 27/115; H01L 27/11521; G11C 16/10
USPC ........................................ 365/185.12, 185.05
See application file for complete search history.

(56) References Cited

U.S. PATENT DOCUMENTS

| | | | |
|---|---|---|---|
| 6,678,190 B2 * | 1/2004 | Yang .................. | G11C 16/0408 365/185.05 |
| 6,920,067 B2 | 7/2005 | Hsu et al. | |

(Continued)

*Primary Examiner* — Jason Lappas
(74) *Attorney, Agent, or Firm* — Jianq Chyun IP Office

(57) ABSTRACT

The invention provides a non-volatile memory cell structure and non-volatile memory apparatus using the same. The non-volatile memory cell structure includes a substrate, first to three wells and first to three transistors. The first to three wells are disposed in the substrate, and the first to three transistors are respectively forming on the first to three wells. The first to third transistors are coupled in series. Wherein, a control end of the first transistor is floated, a control end of the second transistor receives a bias voltage, and a control end of the third transistor is coupled to a word line signal. Moreover, the third well and the second cell are in same type, and the type of the first well is complementary to a type of the third well.

22 Claims, 8 Drawing Sheets

(56) References Cited

U.S. PATENT DOCUMENTS 6,927,997 B2 8/2005 Lee et al.
7,609,539 B2 10/2009 Peng et al.
2014/0063957 A1* 3/2014 Pan .................. H01L 29/7923
  365/185.12

* cited by examiner

NON-VOLATILE MEMORY CELL STRUCTURE AND NON-VOLATILE MEMORY APPARATUS USING THE SAME

CROSS-REFERENCE TO RELATED APPLICATION

This application claims the priority benefits of U.S. provisional application Ser. No. 62/062,963, filed on Oct. 13, 2014. The entirety of the above-mentioned patent application is hereby incorporated by reference herein and made a part of this specification.

BACKGROUND

1. Field of the Invention

The invention relates to a non-volatile memory cell structure and non-volatile memory apparatus. Particularly, the invention relates to a non-volatile memory cell structure and non-volatile memory apparatus capable of using lower operating voltage.

2. Description of Related Art

In conventional art, a float gate type non-volatile memory is implemented by a plurality of I/O metal-oxide-semiconductor field-effect transistor (MOSFET). Such as that, an operating voltage of the conventional non-volatile memory can't be reduce to lower than 1.5V. Due to a worst threshold voltage of the I/O MOSFET is around 0.9V, the utility of the conventional non-volatile memory is restricted in low operating voltage (ex. 1.0V) platform.

In some conventional art, a boost scheme is provided for solving the problem mentioned above in the low voltage platform. The boost scheme in the conventional art is used to boost the operating voltage to a higher voltage (ex. 1.2V), and the higher voltage can be provided to the non-volatile memory. Anyway, the conventional non-volatile memory is operated in the higher voltage, and the circuit size and the power consumption are also large.

SUMMARY OF THE INVENTION

The invention is directed to a non-volatile memory cell structure and a non-volatile memory apparatus using the same, which can be implemented by low voltage components, such as that the circuit size and the operation voltage of the non-volatile memory apparatus can be reduced.

The invention provides a non-volatile memory cell structure including a substrate, first to three wells and first to three transistors. The first to three wells are disposed in the substrate, and the first to three transistors are respectively forming on the first to three wells. The first transistor has a first end coupled to a source line signal. The second transistor has a first end coupled to a second end of the first transistor. The third transistor has a first end coupled to a second end of the second transistor, and a second end coupled to a bit line signal. Wherein, a control end of the first transistor is floated, a control end of the second transistor receives a bias voltage, and a control end of the third transistor is coupled to a word line signal. Moreover, the third well and the second cell are in same type, and the type of the first well is complementary to a type of the third well.

The invention also provides a non-volatile memory apparatus. The non-volatile memory apparatus includes a plurality of non-volatile memory cell structures. The non-volatile memory cell structures are arranged in an array. Each of the non-volatile memory cell structures includes a substrate, first to three wells and first to three transistors. The first to three wells are disposed in the substrate, and the first to three transistors are respectively forming on the first to three wells. The first transistor has a first end coupled to a source line signal. The second transistor has a first end coupled to a second end of the first transistor. The third transistor has a first end coupled to a second end of the second transistor, and a second end coupled to a bit line signal. Wherein, a control end of the first transistor is floated, a control end of the second transistor receives a bias voltage, and a control end of the third transistor is coupled to a word line signal. Moreover, the third well and the second cell are in same type, and the type of the first well is complementary to a type of the third well.

According to the above descriptions, the present application provides the second transistor to be a voltage sharing transistor which blocks high voltage level from source line signal. That is, the third transistor can be implemented by a transistor with lower operating voltage. Such as that, the third transistor can be implemented by a core transistor rather than an I/O transistor. Accordingly, the circuit size and the operating voltage of the non-volatile memory cell structure can be reduced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
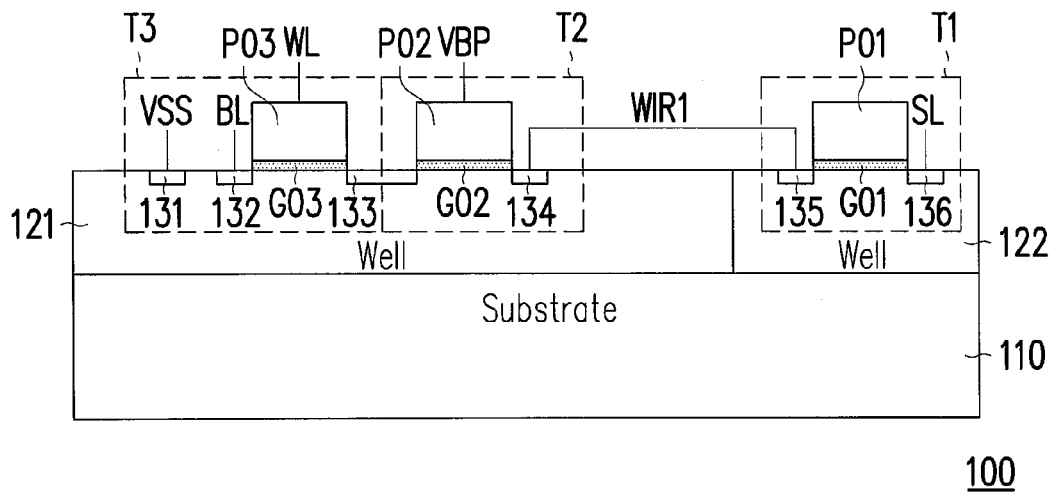
FIG. 1 illustrates a non-volatile memory cell structure according to an embodiment of present application.

Please referring to FIG. 1, FIG. 1 illustrates a non-volatile memory cell structure according to an embodiment of present application. The non-volatile memory cell structure 100 includes substrate 110, wells 121 and 122, and transistors T1-T3. The wells 121 and 122 are disposed on the substrate 110. The transistors T3 and T2 are formed on the well 121 and the transistor T1 is formed on the well 122. Wherein, a first end of the transistor T1 is coupled to a source line signal SL, and a second end of the transistor T1 is coupled to a first end of the transistor T2 by conducting wire WIR1. The control end of the transistor T1 is floated. In the embodiment, the transistor T1 includes a poly gate PO1, a gate oxide layer GO1 and doping areas 135 and 136. The doping areas 135 and 136 are disposed in the well 122, the gate oxide layer GO1 covers on an area of the well 122 between the doping areas 135 and 136, and the poly gate PO1 covers on the gate oxide layer GO1. The substrate 110 may be a P-type substrate. The transistor T1 may be a P-type metal-oxide-semiconductor field-effect transistor (MOSFET) with floating poly gate PO1, and the transistor T1 is used for storing charges for saving data. Besides, the doping areas 135 and 136 are P+ doping areas and the well 122 is N-type well.

That is, the doping area 136 forms the first end of the transistor T1, and the doping area 136 is coupled to the source line signal SL. The doping area 135 forms the second end of the transistor T1, and the doping area 135 is coupled to the conducting wire WIR1. The poly gate PO1 forms the control end of the transistor T1, and the poly gate PO1 is floated.

The second transistor T2 includes a poly gate PO2, a gate oxide layer GO2 and doping areas 133 and 134. The doping areas 133 and 134 are disposed in the well 121, the gate oxide layer GO2 covers on an area of the well 121 between the doping areas 133 and 134, and the poly gate PO2 covers on the gate oxide layer GO2. The transistor T2 may be a N-type MOSFET. Besides, the doping areas 133 and 134 are N+ doping areas and the well 121 is P-type well. The third transistor T3 includes a poly gate PO3, a gate oxide layer GO3 and doping areas 131-133. The doping areas 131-133 are disposed in the well 121, the gate oxide layer GO3 covers on an area of the well 121 between the doping areas 132 and 133, and the poly gate PO3 covers on the gate oxide layer GO3. The transistor T3 may be a N-type MOSFET. Besides, the doping area 132 is a N+ doping area, and the doping area 131 is a P+ doping area.

The transistors T2 and T3 share the doping area 133 to be electrodes thereof, and the doping area 133 forms a second end of the transistor T2 and a first end of the transistor T3. The doping area 134 forms the first end of the transistor T2, and the doping area 134 is coupled to the conducting wire WIR1. The poly gate PO2 of the transistor T2 forms a control end of the transistor T2, and the poly gate PO2 is coupled to a bias voltage VBP. The second end of the transistor T2 is coupled to the first end of the transistor T3 by the sharing doping area 133. Moreover, the poly gate PO3 forms a control end of the transistor T3, and the poly gate PO3 is coupled to a word line signal WL. The doping area 132 forms a first end of the transistor T3, and the doping area 132 is coupled to a bit line signal BL. Furthermore, the doping are 131 forms bulks of the transistors T3 and T2, and the doping are 131 is coupled to a reference ground VSS.

Figure 2:
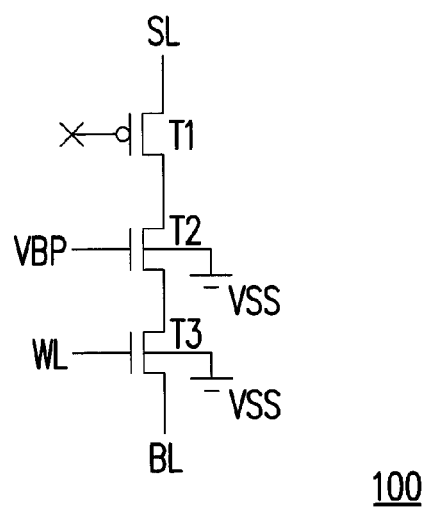
FIG. 2 illustrates an equivalent circuit diagram of the non-volatile memory cell structure 100.

Please referring to FIG. 1 and FIG. 2, wherein the FIG. 2 illustrate an equivalent circuit diagram of the non-volatile memory cell structure 100. In FIG. 2, the transistor T2 is coupled between the transistors T1 and T3 in series, and the transistor T2 is used to be a voltage sharing transistor which blocks a high voltage from the source line signal SL. In detail, when the transistor receives the source line signal with a high voltage level, the transistor T2 reduces the high voltage level coupled from the source line signal SL and prevents the transistor T3 stressed by the high voltage level. In this embodiment, the transistors T1 may be an I/O P-type MOSFET, and can be operated based on the high voltage level. The transistor T2 may be an I/O N-type MOSFET with nominal or low threshold voltage. When the transistor T2 is the I/O N-type MOSFET with nominal threshold voltage, a voltage level of the bias voltage VBP is higher than a voltage level of an operating voltage VDD of the non-volatile memory cell structure 100. On the other hand, when the transistor T2 is the I/O N-type MOSFET with low threshold voltage, the operating voltage VDD is set to be the bias voltage VBP.

Since the transistor T3 is not stressed by the high voltage level from the source line signal, the transistor T3 may be composed by a core N-type MOSFET with smaller operating voltage. A person skilled in the art knows that a circuit size of the core N-type MOSFET is smaller than the I/O MOSFET. That is, the circuit size of the non-volatile memory cell structure 100 can be reduced.

Figure 3:
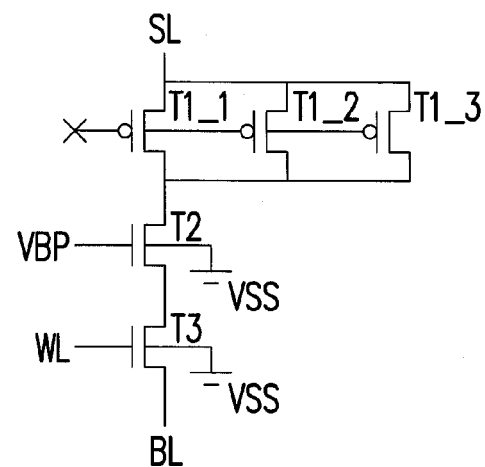
FIG. 3 illustrates a circuit diagram of non-volatile memory cell structure according to another embodiment of present application.

Please referring to FIG. 3, FIG. 3 illustrates a circuit diagram of non-volatile memory cell structure according to another embodiment of present application. In FIG. 3, a plurality of transistors T1_1-T1_3 are used to replace the transistor T1 in FIG. 2. The gates of all of the transistors T1_1-T1_3 are floated, and used to store charges according to stored data. Besides, the number of the transistors T1_1-T1_3 can be varied by designer and not limited to three.

Figure 4:
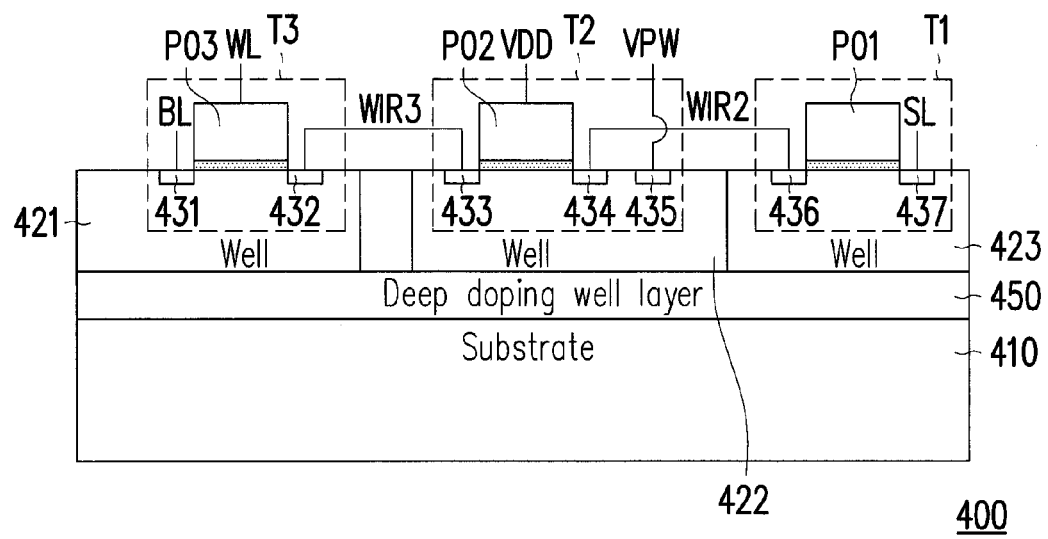
FIG. 4 illustrates a non-volatile memory cell structure according to another embodiment of present application.

Please referring to FIG. 4, FIG. 4 illustrates a non-volatile memory cell structure according to another embodiment of present application. The non-volatile memory cell structure 400 includes substrate 410, a deep doping well layer 450, wells 421-423, and transistors T1-T3. The deep doping well layer 450 is disposed on the substrate 410. The wells 421-423 are disposed on the deep doping well layer 450. The transistors T2 and T3 are respectively formed on the wells 421 and 422, and the transistor T1 is formed on the well 423. Please be noted here, the well 421 and the well 422 are isolated. In the transistor T1, a first end formed by a doping area 437 is coupled to a source line signal SL, a second end formed by a doping area 436 is coupled to the transistor T2 by conducting wire WIR2, and a control end formed by a poly gate PO1 is floated. In the transistor T2, a first end formed by a doping area 434 is coupled to the second end of the transistor T1 through the conducting wire WIR2, a second end formed by a doping area 433 is coupled to the transistor T3 by conducting wire WIR3, a control end formed by a poly gate PO2 is coupled to an operating voltage VDD, and a bulk formed by a doping area 435 is coupled to a reference voltage VPW. In the transistor T3, a first end formed by a doping area 432 is coupled to the second end of the transistor T2 through the conducting wire WIR3, a second end formed by a doping area 431 is coupled to a bit line signal BL, and a control end formed by a poly gate PO3 is coupled to a word line signal WL.

In this embodiment, the substrate 410 may be a P-type substrate, the deep doping well layer 450 is a deep N-type well layer, the wells 421 and 422 are P-type wells, and the well 423 are N-type well. Furthermore, the doping areas 431-434 are N-type doping areas, and the doping areas 435-437 are P-type doping areas. That is, the transistor T1 is a P-type MOSFET, and the transistors T2-T3 are N-type MOSFETs.

Figure 5:
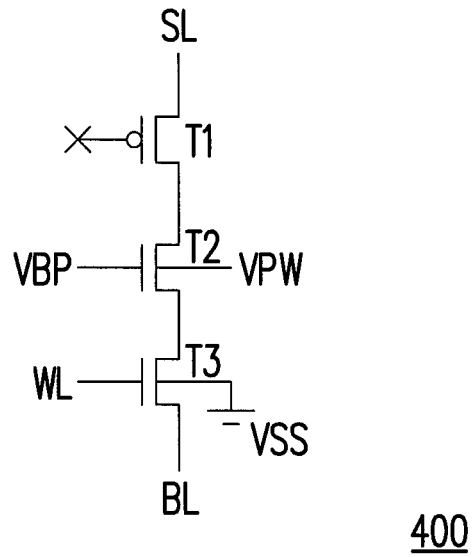
FIG. 5 illustrates an equivalent circuit diagram of the non-volatile memory cell structure 400.

Please referring to FIG. 4 and FIG. 5, wherein the FIG. 5 illustrates an equivalent circuit diagram of the non-volatile memory cell structure 400. In FIG. 5, the transistor T2 is coupled between the transistors T1 and T3 in series, and the transistor T2 is used to be a voltage sharing transistor which blocks a high voltage from the source line signal SL. In detail, the transistor T1 may be composed by an I/O P-type MOSFET for receiving the source line signal with high voltage level. The transistor T2 used to prevent the high voltage level of the source line signal SL from stressing on the transistor T3. Such as that, the transistor T3 may be composed by a core N-type MOSFET with lower operation voltage and smaller circuit size.

Moreover, the transistor T2 may be a nominal threshold voltage isolated MOSFET. The bulk of the transistor T2 may be coupled to the reference voltage VPW which is applied to the P-type well 422. A voltage level of the reference voltage VPW is smaller than a turned-on voltage of a P-N diode formed by the well 422 and the deep doping well layer 450, and the threshold voltage of the transistor T2 is decreased by reverse body effect.

Figure 6:
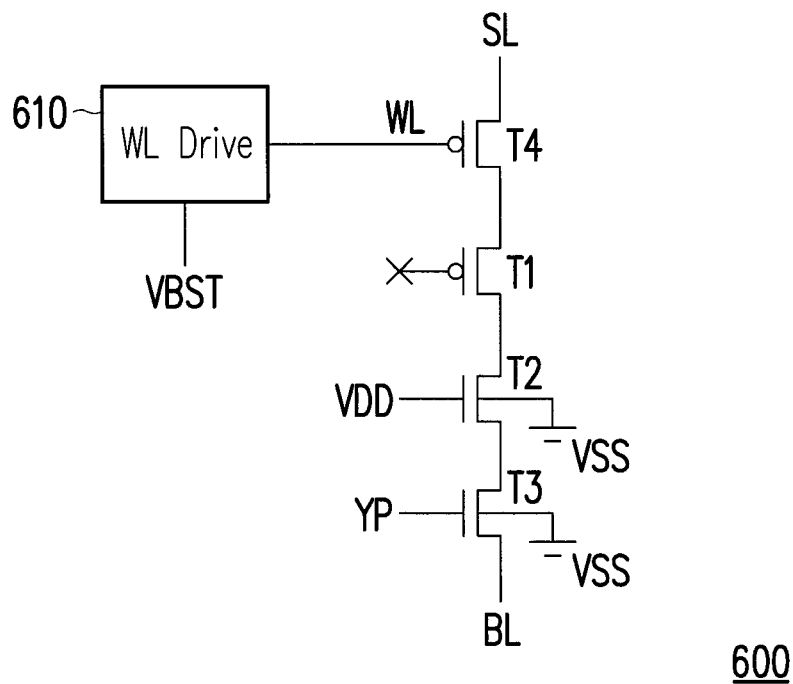
FIG. 6 illustrates an equivalent circuit diagram of a non-volatile memory cell structure according to another embodiment of present application.

Please referring to FIG. 6, FIG. 6 illustrates an equivalent circuit diagram of a non-volatile memory cell structure according to another embodiment of present application. In FIG. 6, different from the non-volatile memory cell structure 100, a transistor T4 is coupled between the transistor T1 and the source line signal SL in the non-volatile memory cell structure 600. A first end of the transistor T4 is coupled to the source line signal SL, a second end of the transistor T4 is coupled to the transistor T1, and a control end of the transistor T4 receives the word line signal WL. Furthermore, in this embodiment, the control end of the transistor T3 receives a Y-decoding signal YP instead, and the second end of the transistor T3 may be connected to a sense amplifier directly. That is, the transistor T3 may be arranged into a Y-path circuit of a non-volatile memory apparatus. Since the transistor can be composed by a core MOSFET with lower operation voltage and smaller circuit size, and the circuit size of the Y-path circuit can be reduced correspondingly.

Please be noted here, the word line signal WL for the the non-volatile memory cell structure 600 is generated by a word line (WL) driver 610. The WL driver 610 receives a voltage VBST and operates a negative boot operation based on the voltage VBST to generate the word line signal WL.

Figure 7A:
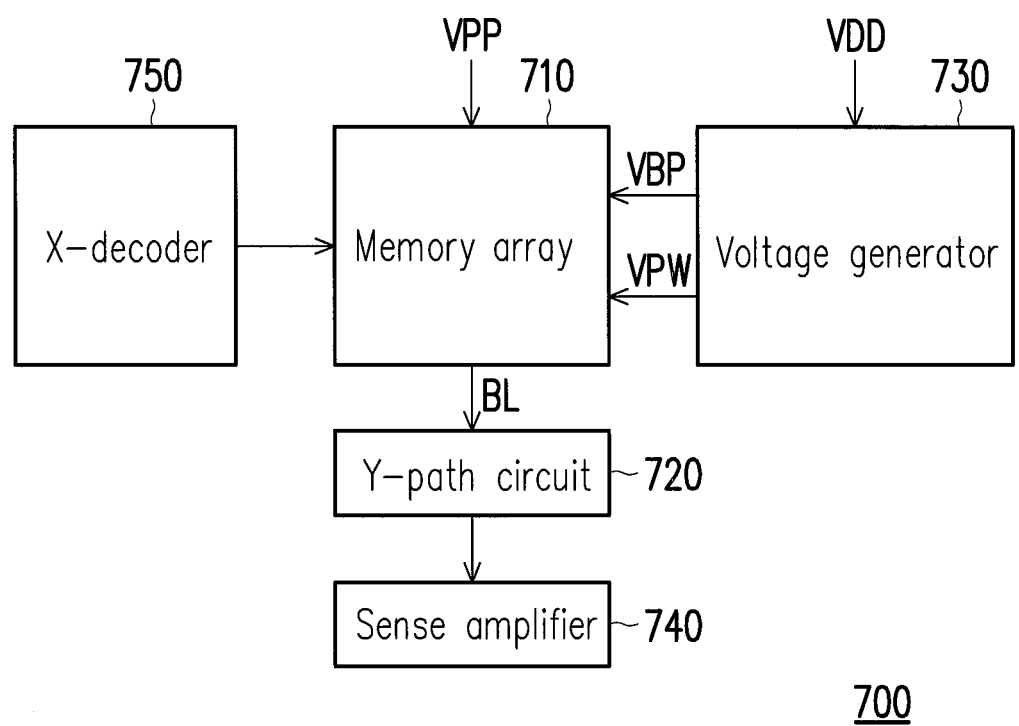
FIG. 7A illustrates a block diagram of a non-volatile memory apparatus according to an embodiment of present application.

Please referring to FIG. 7A, FIG. 7A illustrates a block diagram of a non-volatile memory apparatus according to an embodiment of present application. The non-volatile memory apparatus 700 includes a memory array 710, a Y-path circuit 720, a voltage generator 730, a sense amplifier 740, and a X-decoder 750. The memory array 710 is composed by a plurality of non-volatile memory cell structures, such as the non-volatile memory cell structures shown in FIGS. 2, 3, 5 and 6. An operating voltage VPP is provided to source lines of the non-volatile memory cell structures. Another operating voltage VDD may be provided to the voltage generator 730, and the voltage generator 730 is used to generate a bias voltage VBP and a reference voltage VPW. The bias voltage VBP and reference voltage VPW are provided to the non-volatile memory cell structures in memory array 710. Wherein a voltage level of the operating voltage VPP is larger than a voltage level of the operation voltage VDD. The X-decoder is used to decode address information for accessing the memory array 710, and the Y-path circuit is used to couple to the bit lines BL of the memory array 710 for transporting data information between the sense amplifier 740 and the memory array 710.

Figure 7B:
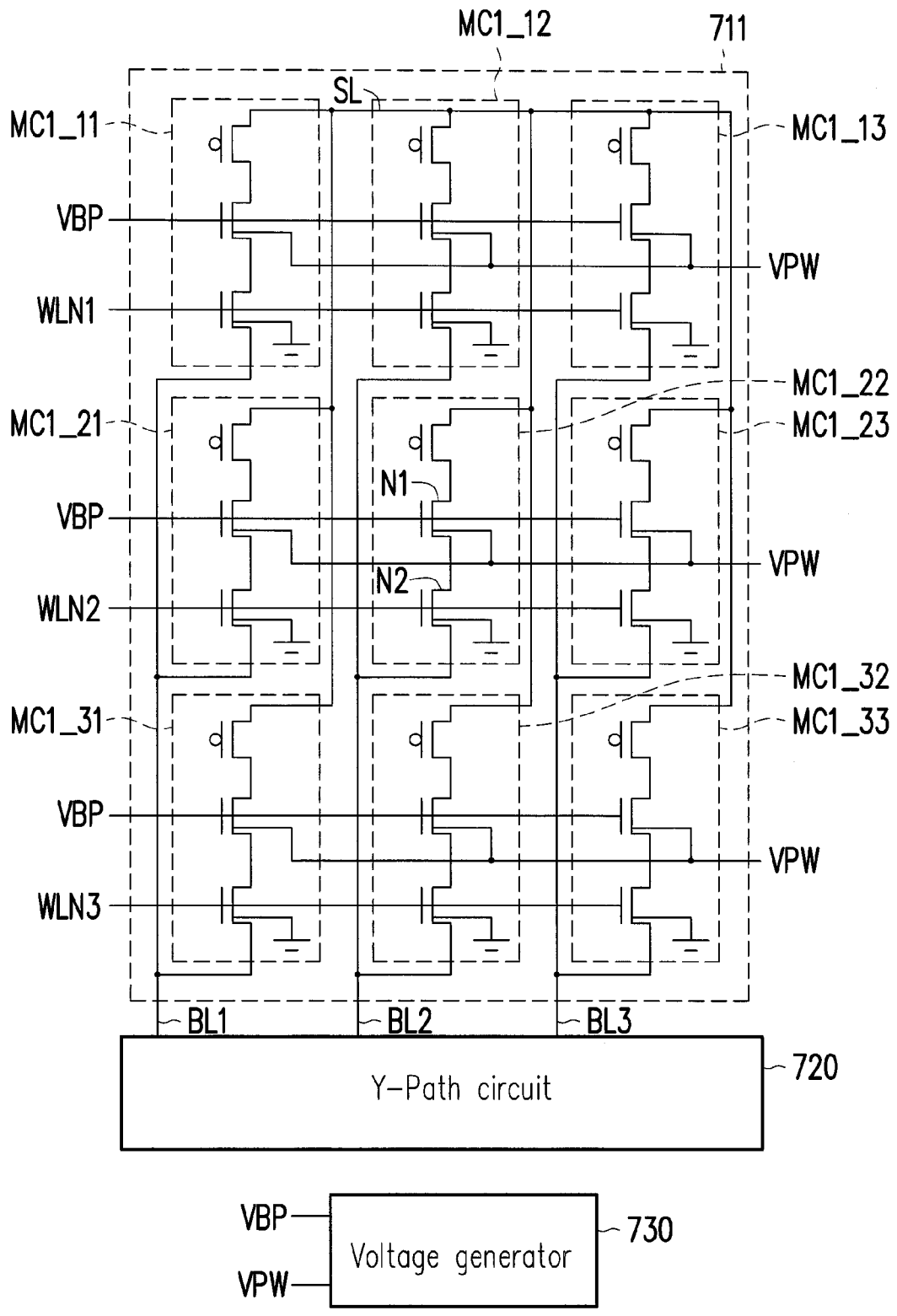
FIG. 7B illustrates a circuit diagram of the non-volatile memory apparatus according to an embodiment of present application in FIG. 7A.

Please referring to FIG. 7B, FIG. 7B illustrates a circuit diagram of the non-volatile memory apparatus according to an embodiment of present application in FIG. 7A. In FIG. 7B, the non-volatile memory apparatus 71 includes a memory array 711, a Y-path circuit 720, and a voltage generator 730, and the memory array 711 includes a plurality of non-volatile memory cell structures MC1_11-MC1_33, and each of the non-volatile memory cell structures MC1_11-MC1_33 may be composed by the non-volatile memory cell structure 400. The non-volatile memory apparatus 71 further includes a plurality of word lines, a plurality of bit lines, and a plurality of source lines. Each of the word lines is coupled to the non-volatile memory cell structures in same row. The word lines are used to respectively receive a plurality of word line signals WLN1-WLN3. In detail, the word line signal WLN1 is provided to the non-volatile memory cell structure MC1_11-MC1_13, the word line signal WLN2 is provided to the non-volatile memory cell structure MC1_21-MC1_23, and the word line signal WLN3 is provided to the non-volatile memory cell structure MC1_31-MC1_33. A source line signal SL is provided to source lines of all of the non-volatile memory cell structure MC_11-MC_33. Each of the bit lines BL1-BL3 is coupled to the non-volatile memory cell structure in the same column. In detail, the bit line BL1 is coupled to the non-volatile memory cell structures MC1_11, MC1_21 and MC1_31; the bit line BL2 is coupled to the non-volatile memory cell structures MC1_12, MC1_22 and MC1_32; and the bit line BL3 is coupled to the non-volatile memory cell structures MC1_13, MC1_23 and MC1_33. The bias voltage VBP and the reference voltage VPW are provided to all of the non-volatile memory cell structures MC1_11-MC1_33. Wherein, the bias voltage VBP may be equal to the operating voltage VDD of the non-volatile memory apparatus 700.

For example, the transistors N1 and N2 may be disposed on a deep doping N-type well (DNW), and the reference voltage VPW may be applied to the bulk of the transistor N1. The control end of the transistor N1 receives the bias voltage VBP. The transistor N2 may be a core transistor coupled in series between the bit line BL2 and the transistor N1, and the control end of the transistor N2 receives the word line signal WLN2.

The Y-path circuit 720 is coupled to the memory array 711 through the bit lines BL1-BL3 for receiving the bit line signals from the memory array 711. Please be noted here, the transistor T3 of all of the non-volatile memory cell structures in the memory array 710 can be arranged into the Y-path circuit 720.

The voltage generator 730 is coupled to the memory array 710 and generates the bias voltage VBP and the reference voltage VPW. For some embodiments, the bias voltage VBP is generated by boosting the operating voltage VDD. The reference voltage VPW can be generated by dividing the operating voltage VDD.

Referring to table I, wherein the table I illustrates an example for voltage setting of the non-volatile memory apparatus 71 in FIG. 7B. The table I is shown as below:

TABLE I

|  | Source line | Reference voltage VPW | Bias voltage VBP | Word line voltage | Bit line voltage |
|---|---|---|---|---|---|
| Reading mode | 1.0 V | 0.5 V | 1 V | 1.0 V (selected) 0 V (unselected) | 0 V |
| Programing mode | 6.5 V | 0.5 V | 1 V | 1.0 V (selected) 0 V (unselected) | 0/1 V |

In the table I, the reference voltage VPW is applied to the bulk of the transistor N1 in FIG. 7B. The transistors N1 is disposed on the DNW, and the reference voltage VPW may be set to 0.5V. The bias voltage VBP is applied to the control ends the transistors N1 of FIG. 7B, and the bias voltage VBP may be set to 1.0V.

Furthermore, the word line voltage is set according to an operating mode of the non-volatile memory cell structure. In a reading mode, the word line voltage which is applied on a selected memory cell is set to 1.0V, and the word line voltage which is applied to an unselected memory cell is set to 0V. In a programming mode, the word line voltage which is applied on a selected memory cell is set to 1.0V, and the word line voltage which is applied to an unselected memory cell is set to 0V. Moreover, the bit line voltage is kept to 0V in the reading mode, and the bit line voltage is varied according to a programming data to the selected memory cell in the programming mode.

Figure 7C:
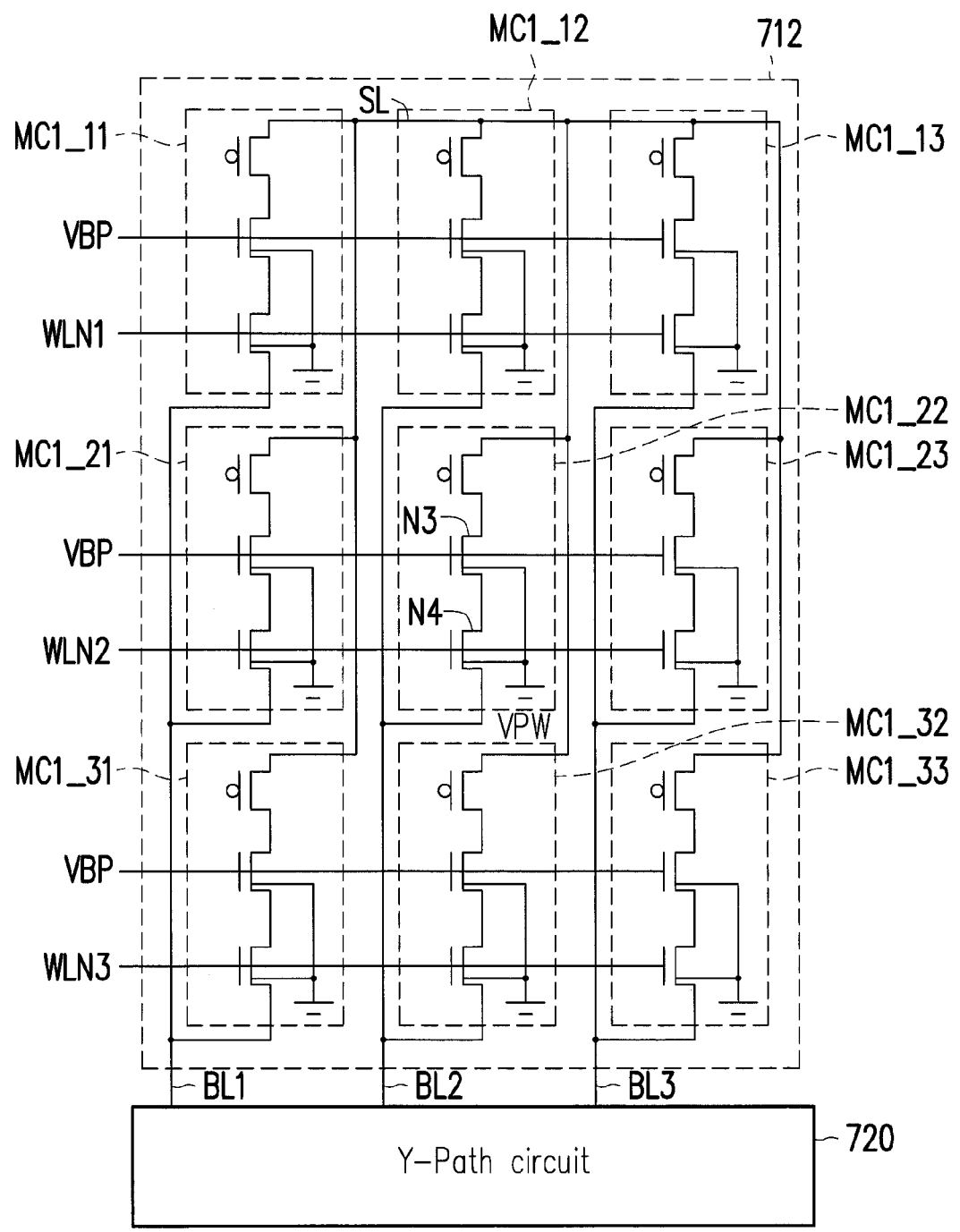
FIG. 7C illustrates the other circuit diagram of the non-volatile memory apparatus according to an embodiment of present application in FIG. 7A.
Figure 7C:
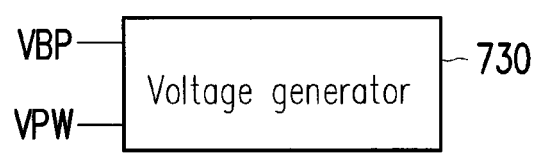

Please referring to FIG. 7C, FIG. 7C illustrates the other circuit diagram of the non-volatile memory apparatus according to an embodiment of present application in FIG. 7A. In FIG. 7C, the non-volatile memory apparatus 72 includes a memory array 712, a Y-path circuit 720, and a voltage generator 730, and the memory array 712 includes a plurality of non-volatile memory cell structures MC2_11-MC2_33, and each of the non-volatile memory cell structures MC2_11-MC2_33 may be composed by the non-volatile memory cell structure 100. The non-volatile memory apparatus 72 further includes a plurality of word lines, a plurality of bit lines, and a plurality of source lines. Each of the word lines is coupled to the non-volatile memory cell structures in same row. The word lines are used to respectively receive a plurality of word line signals WLN1-WLN3. In detail, the word line signal WLN1 is provided to the non-volatile memory cell structure MC2_11-MC2_13, the word line signal WLN2 is provided to the non-volatile memory cell structure MC2_21-MC2_23, and the word line signal WLN3 is provided to the non-volatile memory cell structure MC2_31-MC2_33. A source line signal SL is provided to source lines of all of the non-volatile memory cell structure MC2_11-MC2_33. Each of the bit lines BL1-BL3 is coupled to the non-volatile memory cell structure in the same column. In detail, the bit line BL1 is coupled to the non-volatile memory cell structures MC2_11, MC2_21 and MC2_31; the bit line BL2 is coupled to the non-volatile memory cell structures MC2_12, MC2_22 and MC2_32; and the bit line BL3 is coupled to the non-volatile memory cell structures MC2_13, MC2_23 and MC2_33. The bias voltage VBP and the reference voltage VPW are provided to all of the non-volatile memory cell structures MC2_11-MC2_33.

For example, in the non-volatile memory cell structure MC2_22, the word line signal WLN2 is provided to the control end of the transistor N4, the bias voltage VBP is provided to the control end of the transistor N3 and the reference voltage VPW is provided to both of the bulks of the transistors N3 and N4.

Due to the transistor N3 is a low-threshold I/O MOSFET (native I/O N-type MOS), when a voltage level of the bias voltage VBP is equal to the voltage level of the operating voltage VDD, the transistor N3 is turned on. Further, the transistor N3 may provide voltage sharing to protect the thin MOSFET (transistor N4) when the memory cell structure is in a programming mode. Such as that, the transistor N4 may be a core MOSFET, and can be driven sufficiently by the operating voltage VDD.

In additional, the transistor N3 may also be a nominal MOSFET.

A voltage setting example for the non-volatile memory apparatus 700 in FIG. 7C can be illustrated in table II. The table II is shown as below:

TABLE II

|  | Source line | Reference voltage VPW | Bias voltage VBP | Word line voltage | Bit line voltage |
|---|---|---|---|---|---|
| Reading mode | 1.0 V | 0 V | 1.5 V | 1.0 V (selected) 0 V (unselected) | 0 V |
| Programing mode | 6.5 V | 0 V | 1.5 V | 1.0 V (selected) 0 V (unselected) | 0/1 V |

It should be noted here, in the table II, the reference voltage VPW is applied to the bulk of the transistor N3 which may be a nominal MOSFET in FIG. 7C, and the reference voltage VPW may be set to equal to 0V (the reference ground VSS). Since, the transistors N3 and N4 are disposed on the same well 121, and the bulk of the transistor N4 also receives the reference voltage VPW.

The bias voltage VBP is applied to the control ends of transistor N3 of FIG. 7C. In the table II, the transistor N3 is a nominal transistor, and the bias voltage VBP may be set to 1.5V.

Another voltage setting example for the non-volatile memory apparatus 700 in FIG. 7C can be illustrated in table III. The table III is shown as below:

TABLE III

|  | Source line | Reference voltage VPW | Bias voltage VBP | Word line voltage | Bit line voltage |
|---|---|---|---|---|---|
| Reading mode | 1.0 V | 0 V | 1 V | 1.0 V (selected) 0 V (unselected) | 0 V |
| Programing mode | 6.5 V | 0 V | 1 V | 1.0 V (selected) 0 V (unselected) | 0/1 V |

In the table III, the reference voltage VPW is applied to the bulk of the transistor N3, and the reference voltage VPW may be set to equal to 0V (the reference ground VSS). Moreover, the bias voltage VBP is applied to the control ends of transistor N3 of FIG. 7C, and table III, the transistor N3 is a native transistor, and the bias voltage VBP may be set to 1.0V.

Figure 7D:
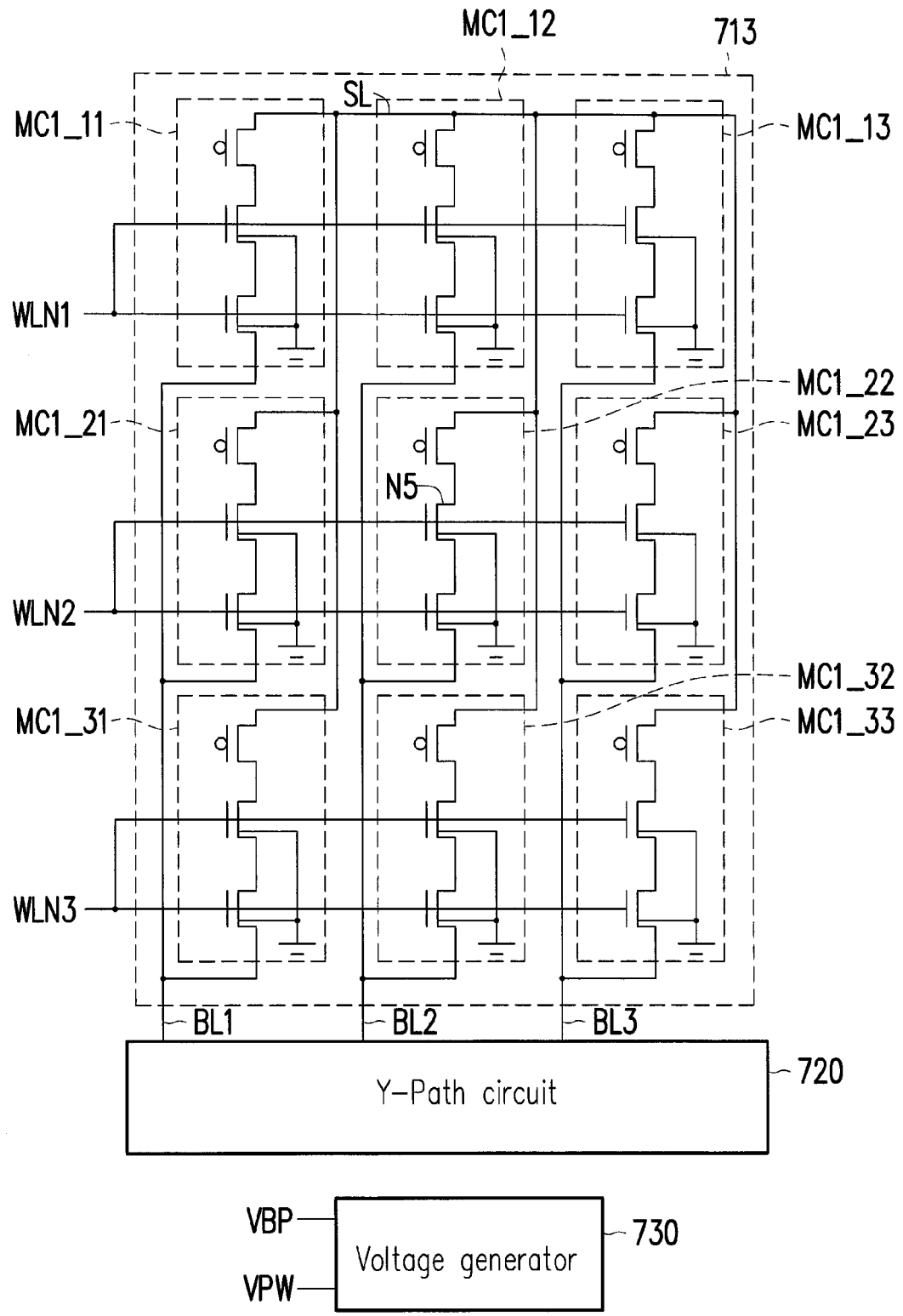
FIG. 7D illustrates another circuit diagram of the non-volatile memory apparatus according to an embodiment of present application in FIG. 7A.

Furthermore, please referring to FIG. 7D, FIG. 7D illustrates another circuit diagram of the non-volatile memory apparatus according to an embodiment of present application in FIG. 7A. In FIG. 7D, the non-volatile memory apparatus 73 includes a memory array 713, a Y-path circuit 720, and a voltage generator 730, and the memory array 713 includes a plurality of non-volatile memory cell structures MC3_11-MC3_33. The non-volatile memory apparatus 73 further includes a plurality of word lines, a plurality of bit lines, and a plurality of source lines. Each of the word lines is coupled to the non-volatile memory cell structures in same row. The word lines are used to respectively receive a plurality of word line signals WLN1-WLN3. In detail, the word line signal WLN1 is provided to the non-volatile memory cell structure MC3_11-MC3_13, the word line signal WLN2 is provided to the non-volatile memory cell structure MC3_21-MC3_23, and the word line signal WLN3 is provided to the non-volatile memory cell structure MC3_31-MC3_33. A source line signal SL is provided to source lines of all of the non-volatile memory cell structure MC3_11-MC3_33. Each of the bit lines BL1-BL3 is coupled to the non-volatile memory cell structure in the same column. In detail, the bit line BL1 is coupled to the non-volatile memory cell structures MC3_11, MC3_21 and MC3_31; the bit line BL2 is coupled to the non-volatile memory cell structures MC3_12, MC3_22 and MC3_32; and the bit line BL3 is coupled to the non-volatile memory cell structures MC3_13, MC3_23 and MC3_33. The bias voltage VBP and the reference voltage VPW are provided to all of the non-volatile memory cell structures MC3_11-MC3_33.

The control ends of the N-type transistors in one memory cell structure are coupled to a same word line. For example, in the non-volatile memory cell structure MC3_22, the control end of the transistor N5 can be changed to be coupled to receive the word line signal WLN2. The voltage setting example for the non-volatile memory apparatus 700 in FIG. 7D can be illustrated in Table IV.

TABLE IV

|  | Source line | Word line voltage | Bit line voltage |
| --- | --- | --- | --- |
| Reading mode | 1.0 V | 1.0 V (selected) 0 V (unselected) | 0 V |
| Programing mode | 6.5 V | 1.0 V (selected) 0 V (unselected) | 0/1 V |

Figure 8A:
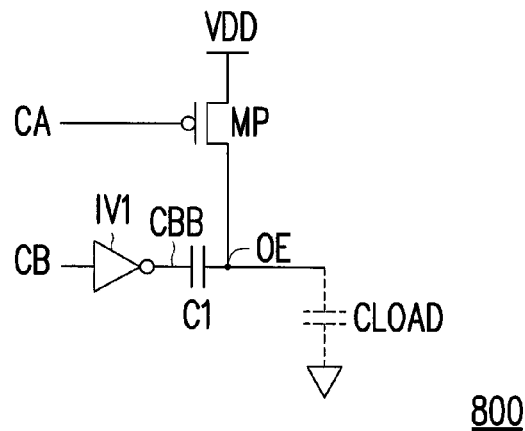
FIG. 8A illustrates a circuit diagram of a part of the voltage generator 730 according to an embodiment of present application.
Figure 8B:
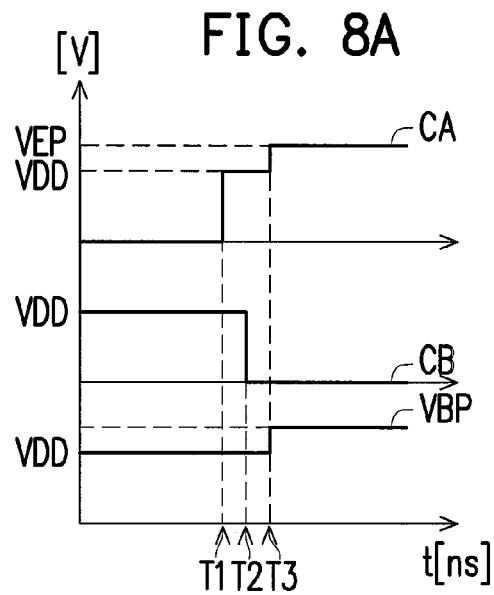
FIG. 8B illustrates a waveform plot of the bias voltage generating circuit 800.

Please referring to FIG. 8A and FIG. 8B, wherein FIG. 8A illustrates a circuit diagram of a part of the voltage generator 730 according to an embodiment of present application. In FIG. 8A, a bias voltage generating circuit 800 is illustrated. The bias voltage generating circuit 800 is used to generate the bias voltage VBP, and includes a transistor MP, an inverter IV1 and capacitor C1. The transistor MP is a P-type MOSFET is coupled between the operating voltage VDD and an output end OE of the voltage generator 730. The transistor MP performs a switch, and is controlled by a first control signal CA to be turned on or cut off. The inverter IV1 receives a second control signal CB and transport an inverted second control signal CBB to a first end of the capacitor C1. A second end of the capacitor C1 is coupled to the output end OE and provides the bias voltage VBP for driving a load capacitor CLOAD.

By refereeing to FIG. 8B, wherein FIG. 8B illustrates a waveform plot of the bias voltage generating circuit 800. Before a time point T1, the transistor MP is turned on according to the first control signal CA, and the bias voltage VBP is equal to the operating voltage VDD. At the time point T1, the first control signal CA is transited to equal to the operating voltage VDD. At the time point T2, the second control signal CB is transited and the inverted second control signal CBB is transited from low voltage to high voltage, and at a time point T3 (after the time point T1 and the time point T2), the first control signal CA is further transited to equal to a voltage VEP. Such as that, the voltage level of the bias voltage VBP is boosted, and the voltage level of the bias voltage VBP is higher than the operating voltage VDD after a time point T3.

Figure 9:
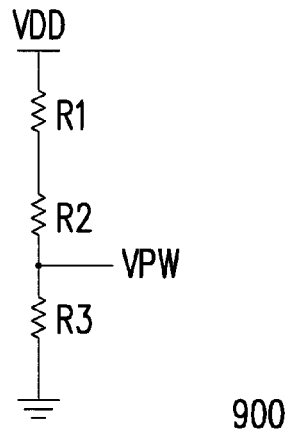
FIG. 9 illustrates a circuit diagram of a part of the voltage generator 730 according to an embodiment of present application.

Please referring to FIG. 9 illustrates a circuit diagram of a part of the voltage generator 730 according to an embodiment of present application. In FIG. 9, a reference voltage generating circuit 900 is illustrated. The reference voltage generating circuit 900 includes a plurality of resistors R1-R3. The resistors R1-R3 are coupled in series between the operating voltage VDD and the reference ground VSS. The reference voltage VPW may be obtained from the connection end of the resistor R2 and R3. Of course, a number of the resistors in reference voltage generating circuit 900 can be adjusted by designer, and the resistance value of each of the resistors R1-R3 may be decided by designer according to a design specification of the non-volatile memory apparatus.

In summary, the present application provides a transistor for sharing the high voltage of the source line signal, and another transistor disposed after the transistor may be composed by core transistor. That is, not all of the transistors in the non-volatile memory cell structure are necessary to be composed by I/O transistor, and some of the transistors can be compose by core transistor for decreasing the circuit size of the non-volatile memory cell structure. Furthermore, since the core transistor can be operated based on the operating voltage with lower voltage level, the power consumption is decreased accordingly.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A non-volatile memory cell structure, comprising:
   a substrate;
   a first well, disposed on the substrate;
   a second well, disposed on the substrate;
   a third well, disposed on the substrate;
   at least one first transistor, forming on the first well and having a first end coupled to a source line signal;
   a second transistor, forming on the second well, and having a first end coupled to a second end of the first transistor; and
   a third transistor, forming on the third well, and having a first end coupled to a second end of the second transistor, a second end coupled to a bit line signal,
   wherein, a control end of the first transistor is floated, a control end of the second transistor receives a bias voltage, and a control end of the third transistor is coupled to a word line signal or a Y-decoding signal, the third well and the second cell are in same type, and the type of the first well is complementary to a type of the third well.

2. The non-volatile memory cell structure as claimed in claim 1, wherein the third well and the second well are the same well.

3. The non-volatile memory cell structure as claimed in claim 2, wherein the second transistor is a native metal-oxide-semiconductor field-effect transistor.

4. The non-volatile memory cell structure as claimed in claim 2, wherein the first transistor is a P-type transistor, the second and third transistors are N-type transistors, and bulks of the second and third transistors are coupled to a reference ground.

5. The non-volatile memory cell structure as claimed in claim 1, wherein the third well and the second well are isolated.

6. The non-volatile memory cell structure as claimed in claim 5, further comprising:
a deep doping well layer; disposed between the substrate and the first to third wells.

7. The non-volatile memory cell structure as claimed in claim 5, wherein the first transistor is a P-type transistor, the second and third transistors are N-type transistors, a bulk of the third transistor is coupled to a reference ground, and a bulk of the second transistor is coupled to a reference voltage.

8. The non-volatile memory cell structure as claimed in claim 7, wherein a voltage level of a reference ground is smaller than a voltage of the reference voltage.

9. The non-volatile memory cell structure as claimed in claim 1, further comprising:
a fourth transistor, having a first end coupled to the selecting signal, a second end coupled to the first end of the first transistor, and a control end receiving the word line signal, wherein, the control end of the third transistor receives the Y-decoding signal.

10. The non-volatile memory cell structure as claimed in claim 1, wherein the bias voltage is provided by the word line signal.

11. A non-volatile memory apparatus, comprising:
a plurality of source lines;
a plurality of bit lines;
a plurality of word lines; and
a plurality of non-volatile memory cell structures, arranged in an array, wherein, each of the non-volatile memory cell structures comprises:
a substrate;
a first well, disposed on the substrate;
a second well, disposed on the substrate;
a third well, disposed on the substrate;
at least one first transistor, forming on the first well and having a first end coupled to corresponding source line;
a second transistor, forming on the second well, and having a first end coupled to a second end of the first transistor; and
a third transistor, forming on the third well, and having a first end coupled to a second end of the second transistor, a second end coupled to corresponding bit line,
wherein, a control end of the first transistor is floated, a control end of the second transistor receives a bias voltage, and a control end of the third transistor is coupled to corresponding word line or a Y-decoding signal, wherein, the third well and the second cell are in same type, and the type of the first well is complementary to a type of the third well.

12. The non-volatile memory apparatus as claimed in claim 11, wherein the third well and the second well are the same well.

13. The non-volatile memory apparatus as claimed in claim 12, wherein the second transistor is a native metal-oxide-semiconductor field-effect transistor.

14. The non-volatile memory apparatus as claimed in claim 12, wherein the first transistor is a P-type transistor, the second and third transistors are N-type transistors, and bulks of the second and third transistors are coupled to a reference ground.

15. The non-volatile memory apparatus as claimed in claim 11, wherein the third well and the second well are isolated.

16. The non-volatile memory apparatus as claimed in claim 15, wherein each of the non-volatile memory cell structures further comprises a deep doping well layer; disposed between the substrate and the first to third wells.

17. The non-volatile memory apparatus as claimed in claim 15, wherein the first transistor is a P-type transistor, the second and third transistors are N-type transistors, a bulk of the third transistor is coupled to a reference ground, and a bulk of the second transistor is coupled to a reference voltage.

18. The non-volatile memory apparatus as claimed in claim 17, wherein a voltage level of a reference ground is smaller than a voltage of the reference voltage.

19. The non-volatile memory apparatus as claimed in claim 11, wherein each of the non-volatile memory cell structure further comprises:
a fourth transistor, having a first end coupled to the selecting signal, a second end coupled to the first end of the first transistor, and a control end receiving the corresponding word line, wherein, the control end of the third transistor receives the Y-decoding signal.

20. The non-volatile memory apparatus as claimed in claim 11, further comprising:
a voltage generator, coupled to the non-volatile memory cell structures for generating the bias voltage according to an operating voltage.

21. The non-volatile memory apparatus as claimed in claim 20, wherein the voltage generator comprises:
a switch, coupled between an operating voltage and an output end of the voltage generator, and controlled by a first control signal, wherein the output end of the voltage generator generates the bias voltage; and
a capacitor, having a first end coupled to a second control signal, and a second end coupled to the output end of the voltage generator,
wherein when the switch is turned on, the second control signal holds on a reference ground voltage, and the second control signal transits to the operating voltage after the switch have been cut off.

22. The non-volatile memory apparatus as claimed in claim 11, wherein the bias voltage received by the corresponding non-volatile memory cell structure is provided by the corresponding word line signal of the corresponding non-volatile memory cell structure.

* * * * *